(12) United States Patent
Su et al.

(10) Patent No.: US 12,419,197 B2
(45) Date of Patent: Sep. 16, 2025

(54) MEMORY DEVICE AND METHOD OF FORMING THE SAME

(71) Applicant: TAIWAN SEMICONDUCTOR MANUFACTURING COMPANY, LTD., Hsinchu (TW)

(72) Inventors: Hsin-Wen Su, Hsinchu (TW); Jui-Lin Chen, Taipei (TW); Shih-Hao Lin, Hsinchu (TW); Chih-Chuan Yang, Hsinchu (TW); Ming-Yen Chuang, Hsinchu (TW); Chenchen Jacob Wang, Hsinchu (TW); Ping-Wei Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 551 days.

(21) Appl. No.: 17/832,601

(22) Filed: Jun. 4, 2022

(65) Prior Publication Data
US 2023/0165160 A1     May 25, 2023

Related U.S. Application Data

(60) Provisional application No. 63/282,880, filed on Nov. 24, 2021.

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/22* (2023.02); *H10N 50/01* (2023.02)

(58) Field of Classification Search
CPC ........ H10N 50/80; H10N 50/01; H10N 50/10; H10B 61/22; G11C 11/161;
(Continued)

(56) References Cited

U.S. PATENT DOCUMENTS

| 8,802,504 | B1 | 8/2014 | Hou et al. |
| 8,803,292 | B2 | 8/2014 | Chen et al. |

(Continued)

FOREIGN PATENT DOCUMENTS

| TW | I576963 B | 4/2017 |
| TW | 202109749 A | 3/2021 |
| TW | I730427 B | 6/2021 |

*Primary Examiner* — Shahed Ahmed
(74) *Attorney, Agent, or Firm* — HAYNES AND BOONE, LLP

(57) ABSTRACT

Some embodiments relate to a memory device. The memory device includes a transistor having a first source/drain (S/D) region and a second S/D region, a first S/D contact disposed over the first S/D region, the first S/D contact extending lengthwise in a first direction, a second S/D contact disposed over the second S/D region, a first via landing on the first S/D contact, the first via extending lengthwise in a second direction different from the first direction, a second via landing on the second S/D contact, the first via having a length measured in the second direction that is larger than the second via, a first conductive line coupled to the first via, a second conductive line coupled to the second via, and a memory structure disposed above the transistor and coupled to the second conductive line.

20 Claims, 11 Drawing Sheets

(58) Field of Classification Search
CPC .......... G11C 2211/5615; G01R 33/098; G11B 5/3909; H01L 23/5226; H01L 21/76877–76883; H01L 29/41725–41791; H01L 23/522–53295; H10D 30/60–798; H10D 30/021–0415; H10D 84/83–859
See application file for complete search history.

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 11,417,832 B2 | 8/2022 | Yin et al. |
| 2007/0164265 A1* | 7/2007 | Kajiyama ............... G11C 11/16 257/3 |
| 2019/0326355 A1* | 10/2019 | Son ........................ H10B 61/22 |
| 2020/0006424 A1* | 1/2020 | Sato ....................... H10B 61/22 |
| 2021/0280773 A1 | 9/2021 | Liao et al. |
| 2021/0375991 A1* | 12/2021 | Ho ........................ H10B 63/84 |
| 2021/0376228 A1 | 12/2021 | Peng et al. |
| 2021/0376231 A1 | 12/2021 | Yin et al. |
| 2021/0391532 A1 | 12/2021 | Yin et al. |
| 2022/0336733 A1 | 10/2022 | Yin et al. |
| 2023/0114539 A1* | 4/2023 | Lee .................... G11C 11/1657 365/158 |

\* cited by examiner

MEMORY DEVICE AND METHOD OF FORMING THE SAME

PRIORITY

This application claims the benefits to U.S. Provisional Application No. 63/282,880, filed Nov. 24, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement in some IC design and fabrication has been the developing of non-volatile memory (NVM), and in particular to magnetic random-access memory (MRAM). MRAM offers comparable performance to volatile static random-access memory (SRAM) and comparable density with lower power consumption to volatile dynamic random access memory (DRAM). Compared to NVM Flash memory, MRAM may offer faster access times and suffer less degradation over time. An MRAM cell is formed by a magnetic tunneling junction (MTJ) comprising two ferromagnetic layers which are separated by a thin insulating barrier, and operates by tunneling of electrons between the two ferromagnetic layers through the insulating barrier. In operation, the variable states (e.g., logical "0" or "1" state) of an MRAM cell is typically read by measuring the resistance of the MTJ. Due to magnetic tunnel effect, the resistance of the MTJ changes with the variable magnetic polarity. When a voltage bias is applied across a combined structure of a top metal line (e.g., a bit line), a MTJ, a control transistor configured to drive the MTJ, and a bottom metal line (e.g., a common source line), one can obtain a series resistance of the combined structure when a current flowing therethrough is measured. The series resistance includes the resistance of the MTJ and additional resistance. The additional resistance shall be reduced to or kept at a desirable value as low as possible in order to improve sensitivity and speed of the MRAM cell. Although existing approaches in MRAM device formation have generally been adequate for their intended purposes, they have not been entirely satisfactory in all respects. For example, routing resistance associated with the control transistor is an unneglectable contributor to the additional resistance in an MRAM cell and may degrade memory circuit performance if its value is high. Accordingly, there exists a need for improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
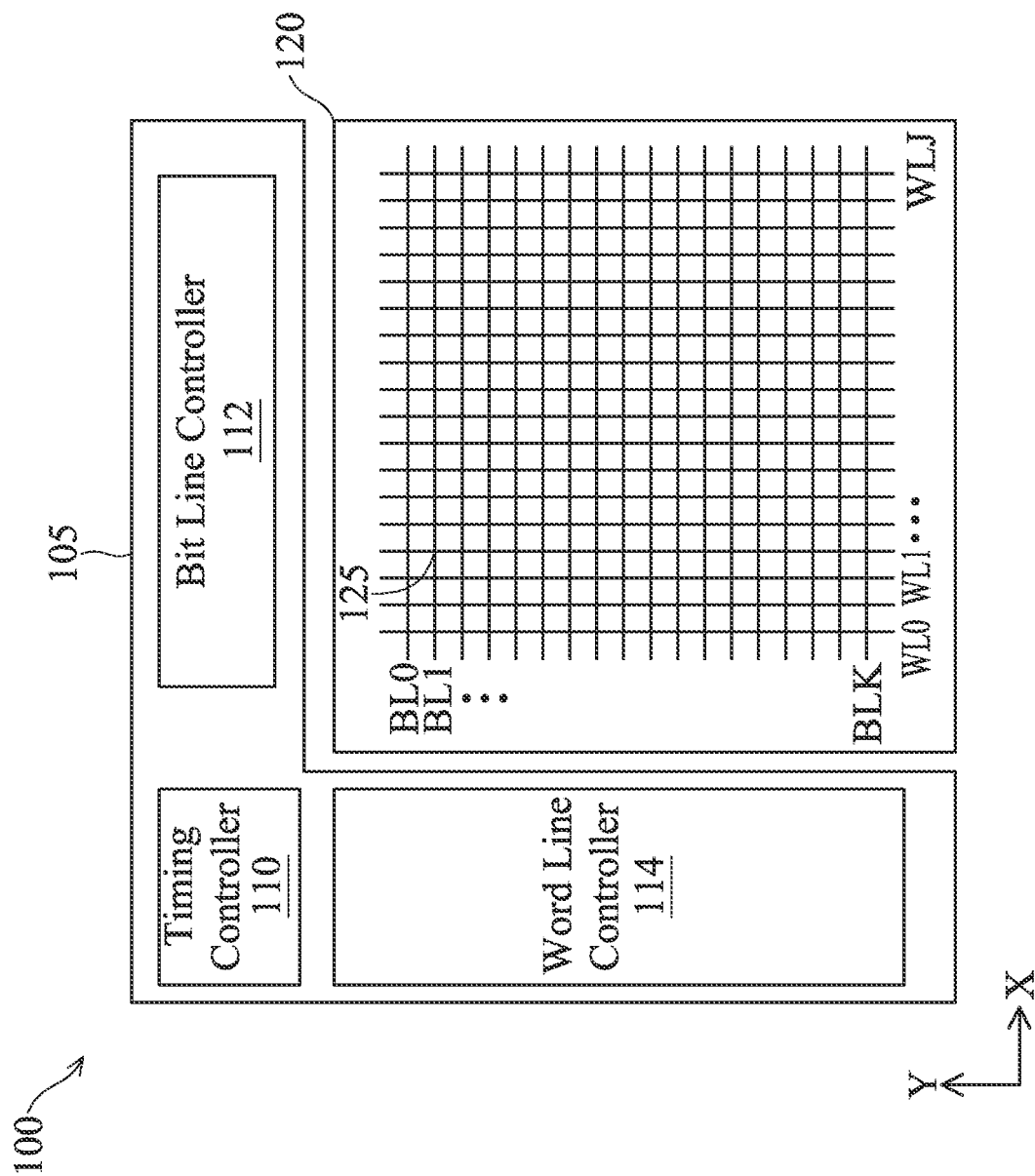
FIG. 1 is a diagram of a memory system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor devices and fabrication methods. More particularly, the present disclosure is related to providing a semiconductor device with an array of magnetic random-access memory (MRAM) devices (or cells) where the routing resistance associated with the transistors configured to control respective magnetic tunneling junctions (MTJs) is reduced. In some embodiments of the present disclosure, MTJs are disposed within metallization layers of a multi-layer interconnect (or MLI). The MTJs are coupled to respective control transistors for read/write control. Vias connecting source contacts of the transistors to conductive lines of a bottom metallization layer of the MLI (e.g., M0) are formed as a rail, which expands contact area between the vias and the source contacts, as well as contact area between the vias and the conductive lines, and in turn reduces routing resistance. By reducing the routing resistance, sensitivity and speed of the MRAM device is improved.

FIG. 1 is a diagram of a memory system 100, in accordance with some embodiments. The memory system 100 includes a memory controller 105 and a memory array 120. The memory array 120 may include a plurality of storage circuits or memory cells 125 arranged in two- or three-dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes bit lines BL0, BL1 ... BLK, each extending in a first direction (e.g., X-direction) and word lines WL0, WL1 ... WLJ, each extending in a second direction (e.g., Y-direction). The word lines WL and the bit lines BL may be conductive metals or conductive rails. In one aspect, each memory cell 125 is coupled to a corresponding word line WL and a corresponding bit line BL, and can be operated according to voltages or currents through the corresponding word line WL and the corresponding bit line BL. In one aspect, each memory cell 125 includes cross-coupled transistors and MTJs. Each memory cell 125 may be magnetic random-access memory (MRAM) memory cell with an MTJ. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, and a timing controller 110. In one configuration, the word line controller 114 is a circuit that provides a voltage or a current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. The bit line controller 112 may be coupled to bit lines BL of the memory array 120, and the word line controller 114 may be coupled to word lines WL of the memory array 120. In one example, to write data to a memory cell 125, the word line controller 114 provides a voltage or current to the memory cell 125 through a word line WL coupled to the memory cell 125, and the bit line controller 112 applies a bias voltage to the memory cell 125 through a bit line BL coupled to the memory cell 125. In one example, to read data from a memory cell 125, the word line controller 114 provides a voltage or current to the memory cell 125 through a word line WL coupled to the memory cell 125, and the bit line controller 112 senses a voltage or current corresponding to data stored by the memory cell 125 through a bit line BL coupled to the memory cell 125. In some embodiments, the memory controller 105 includes more, fewer, or different components than shown in FIG. 1.

Figure 2:
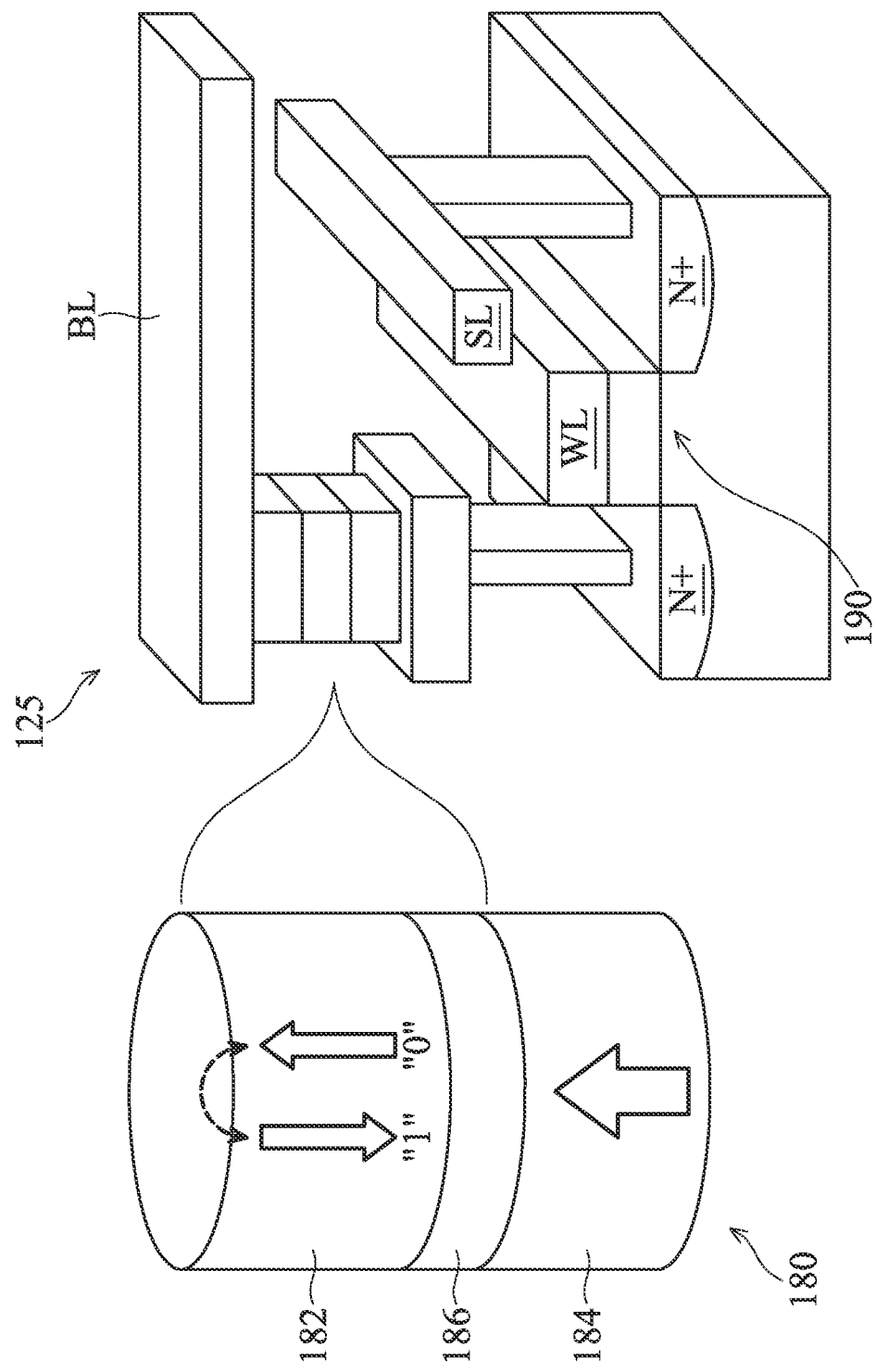
FIG. 2 is a perspective view of a memory cell, in accordance with some embodiments.

FIG. 2 illustrates a perspective view of an example memory cell 125 as a building block of the memory array 120 as shown in FIG. 1. Particularly, FIG. 2 illustrates a memory cell 125 that is an MRAM cell having an MTJ 180 (or MTJ stack 180). The MTJ 180 includes an upper magnetic plate 182 (or top magnetic plate) and a lower magnetic plate 184 (or bottom magnetic plate), which are separated by a thin insulating layer 186, also referred to as a tunnel barrier layer. One of the two magnetic plates (e.g., the lower magnetic plate 184) includes a magnetic layer that is pinned (thus referred to as a pinned layer or a reference layer) to an antiferromagnetic layer (referred to as a pinning layer), while the other magnetic plate (e.g., the upper magnetic plate 42) is a "free" magnetic layer (also referred to as a free layer) that can have its magnetic field changed to one of two or more values to store one of two or more corresponding data states.

The MTJ 180 uses tunnel magnetoresistance to store magnetic fields on the upper and lower magnetic plates 182 and 184. For a sufficiently thin insulating layer 186 (e.g., about 10 nm or less thick), electrons can tunnel from the upper magnetic plate 182 to the lower magnetic plate 184. Data may be written to the cell in many ways. In one method, current is passed between the upper and lower magnetic plates 182 and 184, which induces a magnetic field stored in the free layer (e.g., the upper magnetic plate 182). In another method, spin-transfer-torque (STT) is utilized, wherein a spin-aligned or polarized electron flow is used to change the magnetic field within the free layer with respect to the reference layer. Other methods to write data may be used. However, all data write methods include changing the magnetic field within the free layer with respect to the reference layer.

The electrical resistance of the MTJ 180 changes in accordance with the magnetic fields stored in the upper and lower magnetic plates 182 and 184, due to the magnetic tunnel effect. For example, when the magnetic fields of the upper and lower magnetic plates 182 and 184 are in the same direction (parallel), the MTJ 180 is in a low-resistance state (i.e., a logical "0" state). The resistance of the MTJ 180 under the low-resistance state is denoted as Rp. When the magnetic fields of the upper and lower magnetic plates 182 and 184 are in opposite directions (anti-parallel), the MTJ 180 is in a high-resistance state (i.e., a logical "1" state). The resistance of the MTJ 180 under the high-resistance state is denoted as Rap. The direction of the magnetic field of the upper magnetic plate 182 can be changed by passing a current through the MTJ 180. By measuring the resistance Rp or Rap between the upper and lower magnetic plates 182 and 184, a read circuitry coupled to the MTJ 180 can discern between the "0" and "1" states.

FIG. 2 further shows that the upper magnetic plate 182 of an MTJ 180 is coupled to a bit line (BL), the lower magnetic plate 184 of an MTJ 180 is coupled to a drain (or source) of a transistor 190, the source (or drain) of the transistor 190 is coupled to a source line (SL), and the gate of the transistor 190 is coupled to a word line (WL). That is, the MTJ 180 is sandwiched between the metal grids of word lines and source lines. The MTJ 180 can be accessed (such as read or written) through the bit line and the source line. When data is written to or read from the memory cell 125, a word line is asserted to turn on the transistor 190, and an appropriate bias is applied to a bit line to write or read respective value to or from the respective memory cell 125. Driven by the appropriate bias, a current flowing through a combined structure of the bit line, the MTJ 180, the transistor 190, and the source line is measured. One can thus obtain a series resistance of the combined structure from values of the bias and current and derive the resistance of the MTJ 180. When the routing resistance, denoted as Rs, from the bit line to the drain (or source) of the transistor 190 and from the source line to the source (or drain) of the transistor 190 is not ideal, the derived resistance of the MTJ 180 is actually the low resistance of the MTJ itself plus the routing resistance (i.e., Rp+Rs) under the low-resistance state and the high resistance of the MTJ itself plus the routing resistance (i.e., Rap+Rs) under the high-resistance state.

Operation speed and read/write margins of a memory cell 125 can be benchmarked by tunnel magnetoresistance ratio (TMR), defined as TMR=((Rap+Rs)−(Rp+Rs))/(Rp+Rs)=(Rap−Rp)/(Rp+Rs).

Since the routing resistance Rs is in the denominator of the expression of TMR, the routing resistance degrades TMR. Accordingly, additional resistance other than the resistance of the MTJ itself shall be reduced to or kept at a desirable value as low as possible to safeguard sensitivity and speed of the memory cell. There is, however, a large portion of routing resistance due to vias in the memory cell, such as vias connecting the source/drain regions of the transistor 190 to respective source line and bit line. There is a need to reduce routing resistance associated with vias for achieving larger read/write margins and faster read/write operations of the memory cells.

Figure 3:
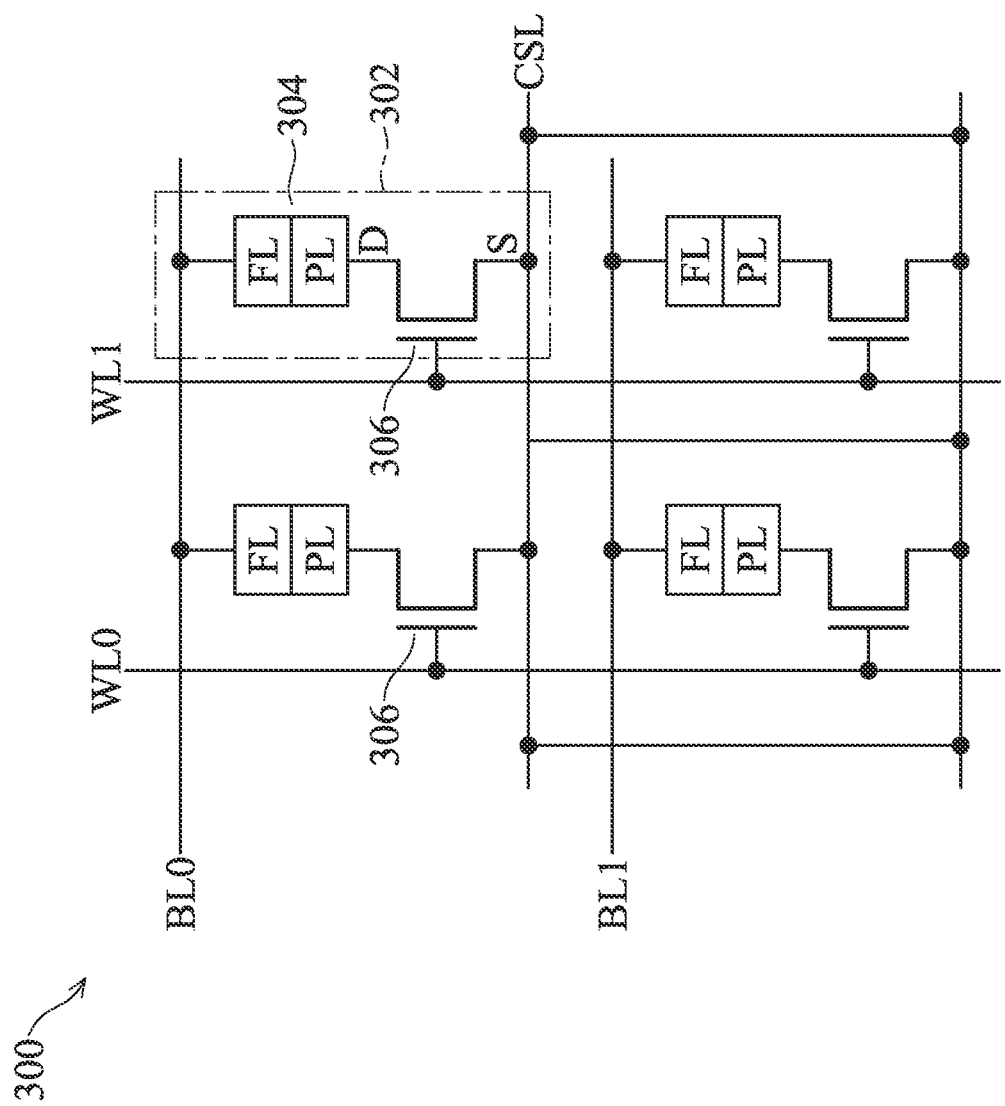
FIG. 3 illustrates a schematic view of a memory array, in accordance with some embodiments.

FIG. 3 illustrates a schematic view of a memory array 300, in accordance with an embodiment. The memory array 300 includes a plurality of memory cells 302, which may be implemented as the memory cells 125 in FIGS. 1 and 2. Each of the memory cell 302 includes an MTJ 304 illustrated as a free layer FL and a corresponding pinned layer PL for simplicity. As illustrated in FIG. 3, the memory array 300 includes MTJs 304 organized in an array (e.g., in rows and columns), and has bit lines (e.g., BL0, BL1), word lines (e.g., WL0, WL1), and common source lines (e.g., CSL). Each of the MTJ 304 is coupled between a bit line and a drain of a corresponding transistor 306. A gate of the transistor 306 is coupled to a word line, and a source of the transistor 306 is coupled to a common source line. When a transistor 306 is turned on, a current flowing through the drain and the source of the transistor 306 is determined by the resistance of the MTJ 304 (e.g., a high resistance Rap or a low resistance Rp), and the current is used to determine whether a "0" or a "1" is stored in the MTJ 304. As illustrated in FIG. 3, one MTJ 304 is associated with one transistor 306. In some alternative embodiments, one MTJ 304 may be associated with two or more transistors connected in parallel. The configuration of transistors connected in parallel reduces channel resistance contributed from the transistors. Further, in the example of FIG. 3, four bits are stored by the four MTJs 304. One skilled in the art will readily appreciate that the memory array 300 may include more MTJs 304 than illustrated in FIG. 3 to store a predetermined amount of data bits.

Figure 4:
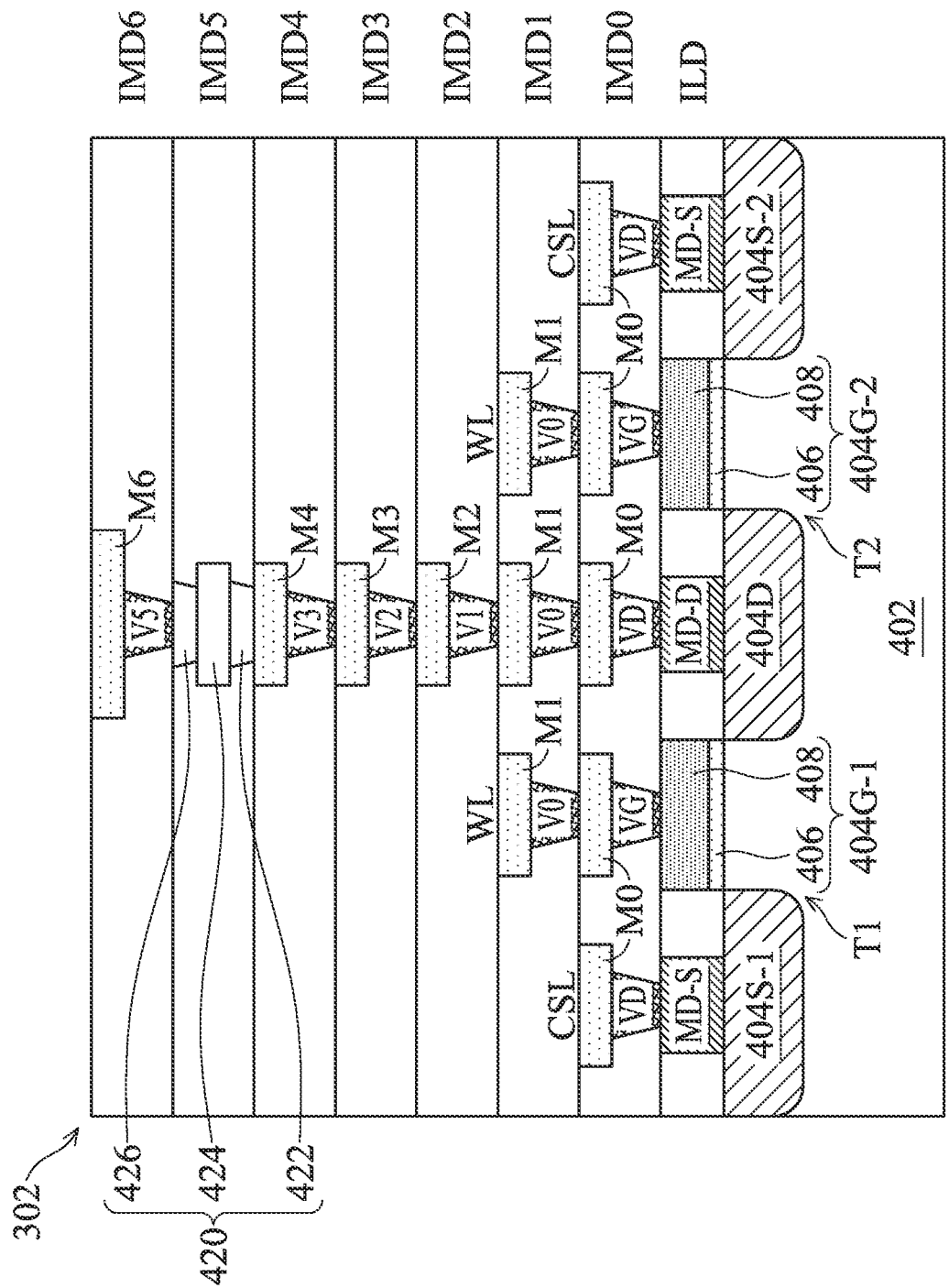
FIG. 4 illustrates a cross-sectional view of a semiconductor device with a memory array comprising MTJs, in accordance with some embodiments.

FIG. 4 illustrates a schematic cross-sectional view of the memory array 300 of FIG. 3, in accordance with an embodiment. For simplicity, FIG. 4 illustrates only a portion of the memory array 300, particular the memory cell 302 in the dashed rectangular box shown in FIG. 3.

As illustrated in FIG. 4, the memory cell 302 includes a first transistor T1 and a second transistor T2 arranged on a substrate 402. In one embodiment, the transistors T1 and T2 are field-effect transistors (FETs), such as metal-oxide-semiconductor field-effect transistors (MOSFETs). In some embodiments, the transistors T1 and T2 are formed as planar FETs or non-planar FETs. In furtherance of some embodiments, each of the transistors T1 and T2 is a FinFET device. FinFETs may have one or more non-planar gate structures for wrapping partially or completely around one or more channel regions. As illustrated in FIG. 4, the first transistor T1 has a gate structure 404G-1 disposed over the substrate 402 between a source region 404S-1 and a drain region 404D. The second transistor T2 has a gate structure 404G-2 disposed over the substrate 402 between a source region 404S-2 and the drain region 404D. The drain region 404D is a common drain region shared by the transistors T1 and T2. The source regions 404S-1, 404S-2 and the drain region 404D are collectively referred to as source/drain regions 404. Each of the gate structures 404G-1 and 404G-2 includes a gate electrode 408 separated from the substrate 402 by a gate dielectric 406. In some embodiments, the gate electrode 408 may comprise polysilicon. In such embodiments, the gate dielectric 406 may include a dielectric material, such as an oxide (e.g., silicon dioxide), a nitride (e.g., silicon-nitride), or the like. In other embodiments, the gate electrode 408 may comprise a metal, such as aluminum, copper, titanium, tantalum, tungsten, molybdenum, cobalt, or the like. In such embodiments, the gate dielectric 406 may comprise a high-k dielectric material, such as hafnium oxide, hafnium silicon oxide, hafnium tantalum oxide, aluminum oxide, zirconium oxide, or the like.

Source/drain contacts MD are formed over the source/drain regions 404. Particularly, source contacts MD-S are formed over the source regions 404S-1 and 404S-2 in an interlayer dielectric (ILD) layer. Drain contact MD-D is formed over the common drain region 404D in the ILD layer. A plurality of inter-metal dielectric (IMD) layers (e.g., IMD0-IMD6) are formed over the ILD layer, with each IMD layer having conductive lines (e.g., M0-M6) and vias (e.g., VD and V0-V5) formed therein. In the example of FIG. 4, vias VD connect the source contacts MD-S and the drain contact MD-D to respective conductive lines M0 formed in the IMD layer IMD0. Similarly, gate vias VG connect the gate structures 414G-1 and 414G-2 to respective conductive lines M0 formed in the IMD layer IMD0. The via V0 connects the conductive line M0 to the conductive line M1 formed in the IMD layer IMD1. The via V1 connects the conductive line M1 to the conductive line M2 formed in the IMD layer IMD2. The via V2 connects the conductive line M2 to the conductive line M3 formed in the IMD layer IMD3. The via V3 connects the conductive line M3 to the conductive line M4 formed in the IMD layer IMD4. In the example of FIG. 4, the MTJ structure 420 is formed in the IMD layer IMD5. The MTJ structure 420 illustrated in FIG. 4 is a simplified schematic view showing a bottom electrode via (BEVA) 422, an MTJ 424, and a top electrode via (TEVA) 426. The BEVA 422 connects the conductive line M4 to the MTJ 424. The TEVA 426 connects the MTJ 424 to the via V5 formed in the IMD layer IMD6. The via V5 connects the TEVA 426 to the conductive line M6 formed in the IMD layer IMD6. The two conductive lines M0 coupled to the two source regions 404S-1 and 404S-2 are further coupled together, forming the common source line (CSL). The two conductive lines M1 coupled to the two gate structures 404G-1 and 404G-2 are further coupled together, as the word line (WL). Accordingly, the transistors T1 and T2 are connected in parallel. The parallel configuration of the transistors T1 and T2 reduces channel resistance by half when the transistors T1 and T2 are turned on. While the channel resistance can be reduced with parallel configuration of the transistors, vias VD may still serve as a major contributor to the routing resistance, particularly due to generally small cross-sectional areas of this type of vias.

In the illustrated embodiment in FIG. 4, the word lines WL (e.g., WL0, WL1) of the memory array are formed in the IMD layer IMD1, the common source line CSL are formed in the IMD layer IMD0, the bit lines BL (e.g., BL0, BL1) are formed in the IMD layer IMD6, and the MTJ structure is formed in the IMD layer IMD5. These are, of course, merely examples and non-limiting. The word lines, bit lines, common source line, and the MTJ structure may be formed in other IMD layers, these and other variations are fully intended to be included within the scope of the present disclosure.

Figure 5:
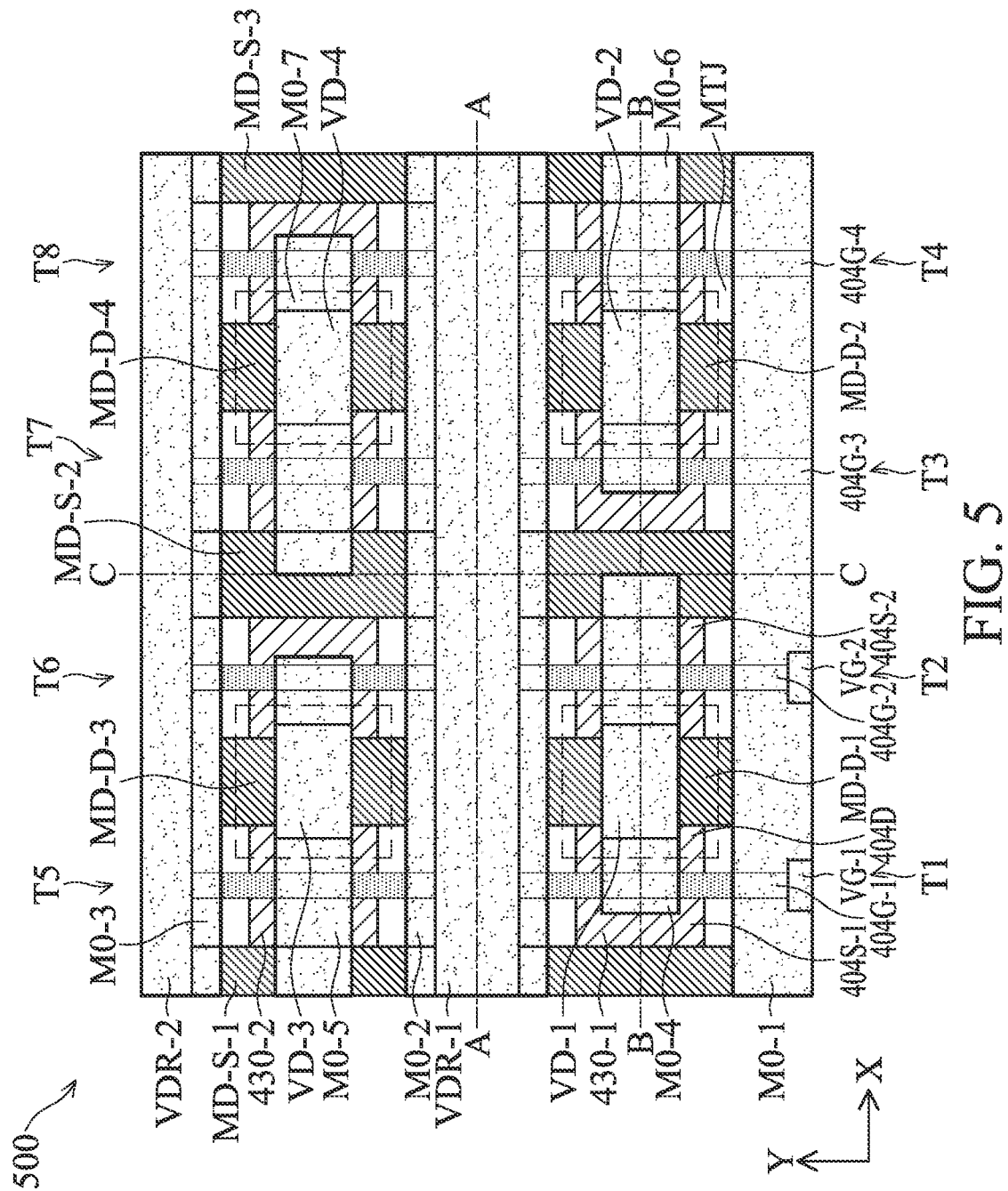
FIG. 5 illustrates a top view of a semiconductor device with a memory array comprising MTJs, in accordance with some embodiments.

FIG. 5 is a layout or a top view 500 of a portion of a memory array comprising MTJs, in accordance with some embodiments. In some embodiments, the memory array includes gate structures 404G-1, 404G-2, 404G-3, 404G-4 (collectively, gate structures 404G) elongated along the Y-direction, active regions 430-1, 430-2 (collectively, active regions 430) elongated along the X-direction. These components may be arranged and function as the memory array 300 described above with respect to FIG. 3. In one aspect, the memory array 300 includes more, fewer, or different components than shown in FIG. 5. For example, the memory array 300 includes additional components (e.g., routing metals, via contacts) that are not shown in FIG. 5.

In the illustrated embodiment, transistors T1-T8 are formed where the gate structures 404G-1, 404G-2, 404G-3, 404G-4 and active regions 430-1, 430-2 intersect. For example, a transistor T1 is formed, at which the active region 430-1 and the gate structure 404G-1 intersect. For example, a transistor T2 is formed, at which the active region 430-1 and the gate structure 404G-2 intersect. In some embodiments, the transistors T1 and T2 are formed as planar FETs or non-planar FETs. In furtherance of some embodiments, each of the transistors T1 and T2 is a FinFET device. The transistor T1 includes a source region 404S-1 and a drain region 404D. The transistor T2 includes a source region 404S-2 and the drain region 404D. The transistors T1 and T2 share the drain region 404D. The source regions and common drain regions of the other transistors T3-T8 are similarly disposed in the layout 500 and not reiterated herein for the sake of conciseness.

The memory array includes source contacts MD-S-1, MD-S-2, MD-S-3 (collectively, source contacts MD-S) elongated along the Y-direction. Each of the source contact MD-S extends across the active regions 430-1 and 430-2 and in contact with the source regions formed in the active regions 430-1 and 430-2. Accordingly, sources regions associated with the same gate structure in different active regions are coupled together through the respective source contact MD-S. In one example, each of the source contacts MD-S has a width along the X-direction from about 15 nm to about 25 nm. The memory array also includes drain contacts MD-D-1, MD-D-2, MD-D-3, MD-D-4 (collectively, drain contacts MD-D) elongated along the Y-direction. Each of the drain contact MD-D extends across the respective common drain region. For example, the drain contact MD-D-1 is in contact with the common drain region of the transistors T1 and T2, the drain contact MD-D-2 is in contact with the common drain region of the transistor T3 and T4, the drain contact MD-D-3 is in contact with the common drain region of the transistors T5 and T6, and the drain contact MD-D-4 is in contact with the common drain region of the transistors T7 and T8. In one example, each of the drain contact MD-D has a length along the Y-direction from about 35 nm to about 50 nm, and a width along the X-direction from about 15 nm to about 25 nm.

The memory array includes conductive lines M0-1, M0-2, M0-3, M0-4, M0-5, M0-6, M0-7 (collectively, conductive lines M0) formed in the IMD layer IMD0 and elongated along the X direction. The conductive line M0-1 extends across the gate structures 404G-1, 404G-2, 404G-3, 404G-4. The gate via VG-1 connects the gate structure 404G-1 to the conductive line M0-1. The gate via VG-2 connects the gate structure 404G-2 to the conductive line M0-1. Not depicted in FIG. 5, the conductive line M0-1 is further coupled to a conducive line M1 as a word line formed in the IMD layer IMD1, such as illustrated in FIG. 4.

The conductive line M0-2 extends across the source contacts MD-S-1, MD-S-2, MD-S-3. The conductive line M0-2 serves as a common source line (CSL). Other than relying on multiple vias VD individually connecting each source contact to the conductive line M0-2, a via rail VDR-1 is formed between the source contacts MD-S-1, MD-S-2, MD-S-3 and the conductive line M0-2. The via rail VDR-1 connects each of the source contacts MD-S-1, MD-S-2, MD-S-3 to the conductive line M0-2. In the illustrated embodiment, the via rail VDR-1 has a length along the X-direction same as the conductive line M0-2 and a width along the Y-direction smaller than the conductive line M0-2. In one example, the conductive line M0-2 has a width from about 25 nm to about 35 nm, and the via rail VDR-2 has a width from about 15 nm to about 20 nm. By having one continuous via rail other than multiple individual vias, the contact area between the via and the conductive line M0-2 and the contact area between the via and the source contacts MD-S are both increased, which leads to smaller routing resistance for the common source line. In some instances, the routing resistance for the common source line may be reduced for about 15% by implementing the via rail. Similarly, the conductive line M0-3 extends across the source contacts MD-S-1, MD-S-2, MD-S-3, and the via rail VDR-2 connects each of the source contacts MD-S-1, MD-S-2, MD-S-3 to the conductive line M0-3.

Each of the conductive lines M0-4, M0-5, M0-6, M0-7 extends across the respective drain contact MD-D. The conductive lines M0-4 and M0-7 also overlap with the source contact MD-S-2 in a top view. The conductive line M0-5 overlaps with the source contact MD-S-1 in a top view. The conductive line M0-6 overlaps with the source contact MD-S-3 in a top view. In one example, each of the conductive lines M0-4, M0-5, M0-6, M0-7 has a length along the X-direction from about 70 nm to about 95 nm, and a width along the W-direction from about 12 nm to about 25 nm. That is, the width of the conductive lines M0-4, M0-5, M0-6, M0-7 is smaller than the width of the conductive line M0-2. Multiple vias VD-1, VD-2, VD-3, VD-4 (collectively, vias VD) connect the drain contacts MD-D to the respective conductive lines M0-4, M0-5, M0-6, M0-7 thereabove. Particularly, the via VD-1 connects the drain contact MD-D-1 to the conductive line M0-4, the via VD-2 connects the drain contact MD-D-2 to the conductive line M0-6, the via VD-3 connects the drain contact MD-D-3 to the conductive line M0-5, and the via VD-4 connects the drain contact MD-D-4 to the conductive line M0-7. Each of the vias VD has an extended width along the X-direction that is larger than the width of the respective drain contact MD-D along the X-direction. The extended width increases the contact area between the vias VD and the respective drain contact MD-D and helps reducing routing resistance. The vias VD with an extended width are also referred to as slot vias VD. In the illustrated embodiment, the width of the vias VD along the Y-direction is substantially the same as the width of the conductive lines M0-4, M0-5, M0-6, M0-7. In some embodiments, the slot via VD has a square space in a top view with extended width on all four sides. In some alternative embodiments, the slot via VD has a rectangular shape in a top view, as shown in FIG. 5. The conductive lines M0-4, M0-5, M0-6, M0-7 couple the drain contacts MD-D to MTJs formed in a higher IMD layer (e.g., IMD5). The four MTJs overlying four associated drain contacts MD-D in the layout 500 are represented by four dashed square boxes in FIG. 5.

Figure 6A:
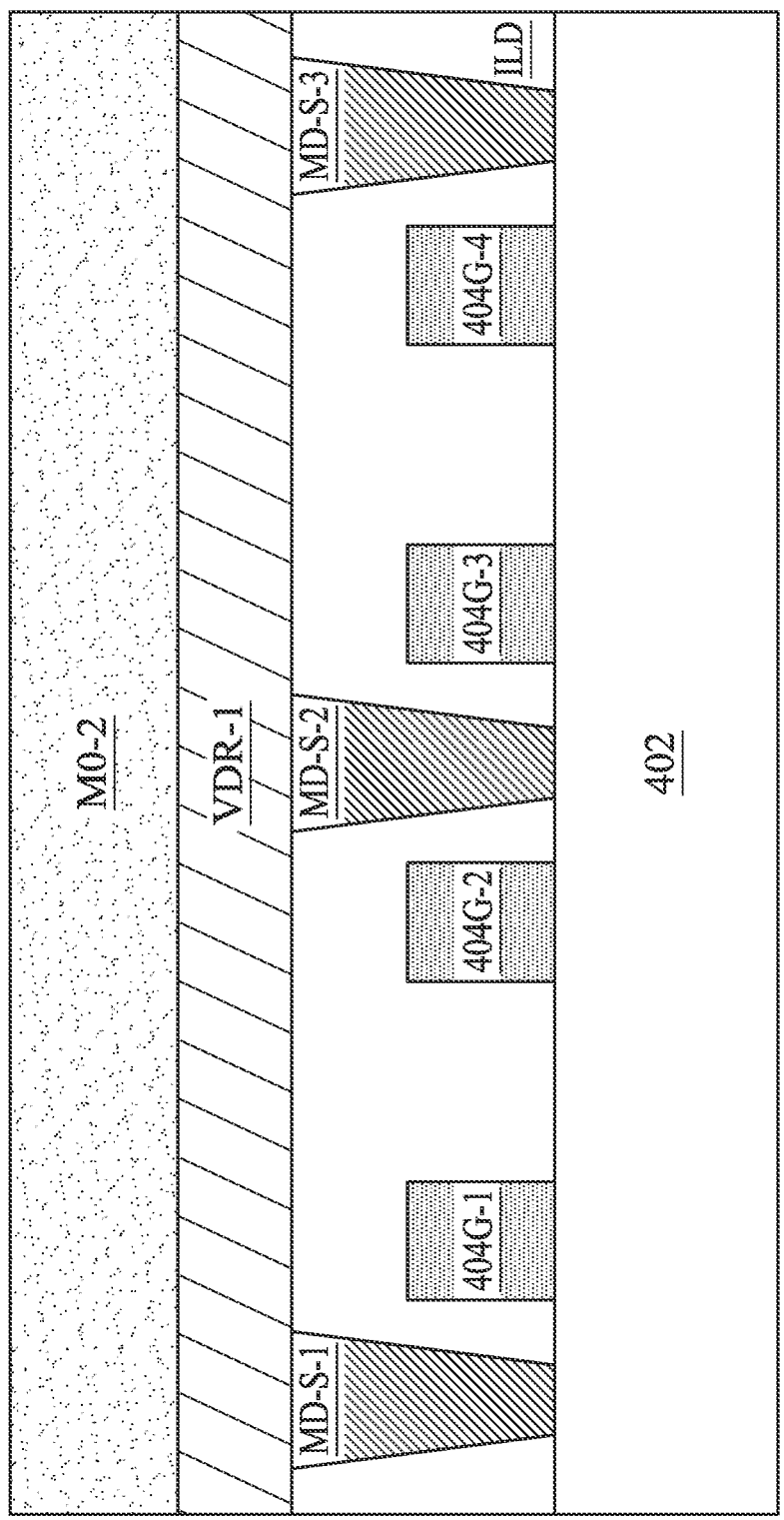
FIGS. 6A, 6B, 6C, 7A, and 7B illustrate cross-sectional views of the semiconductor device in FIG. 5, in accordance with some embodiments.
Figure 6B:
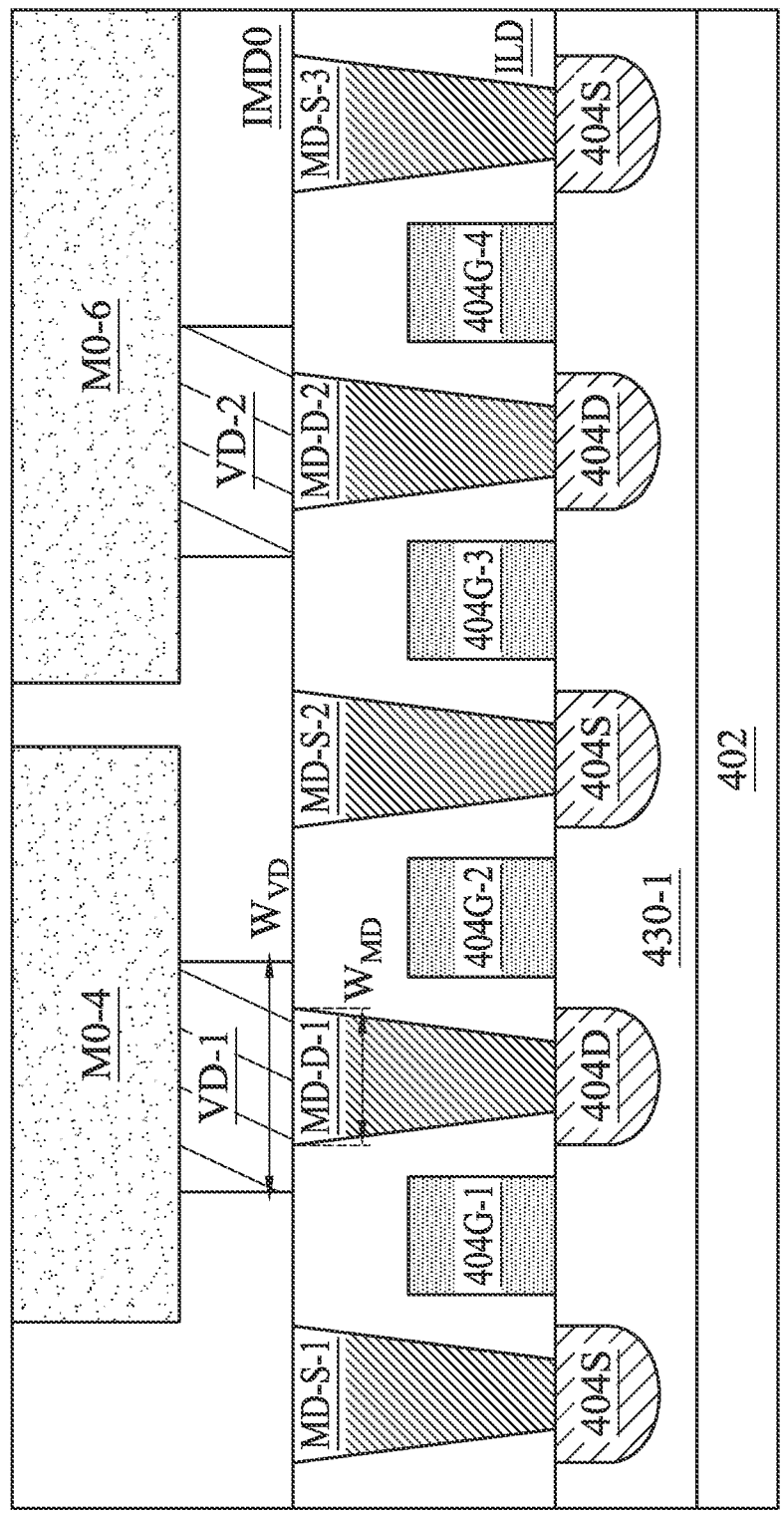
Figure 6C:
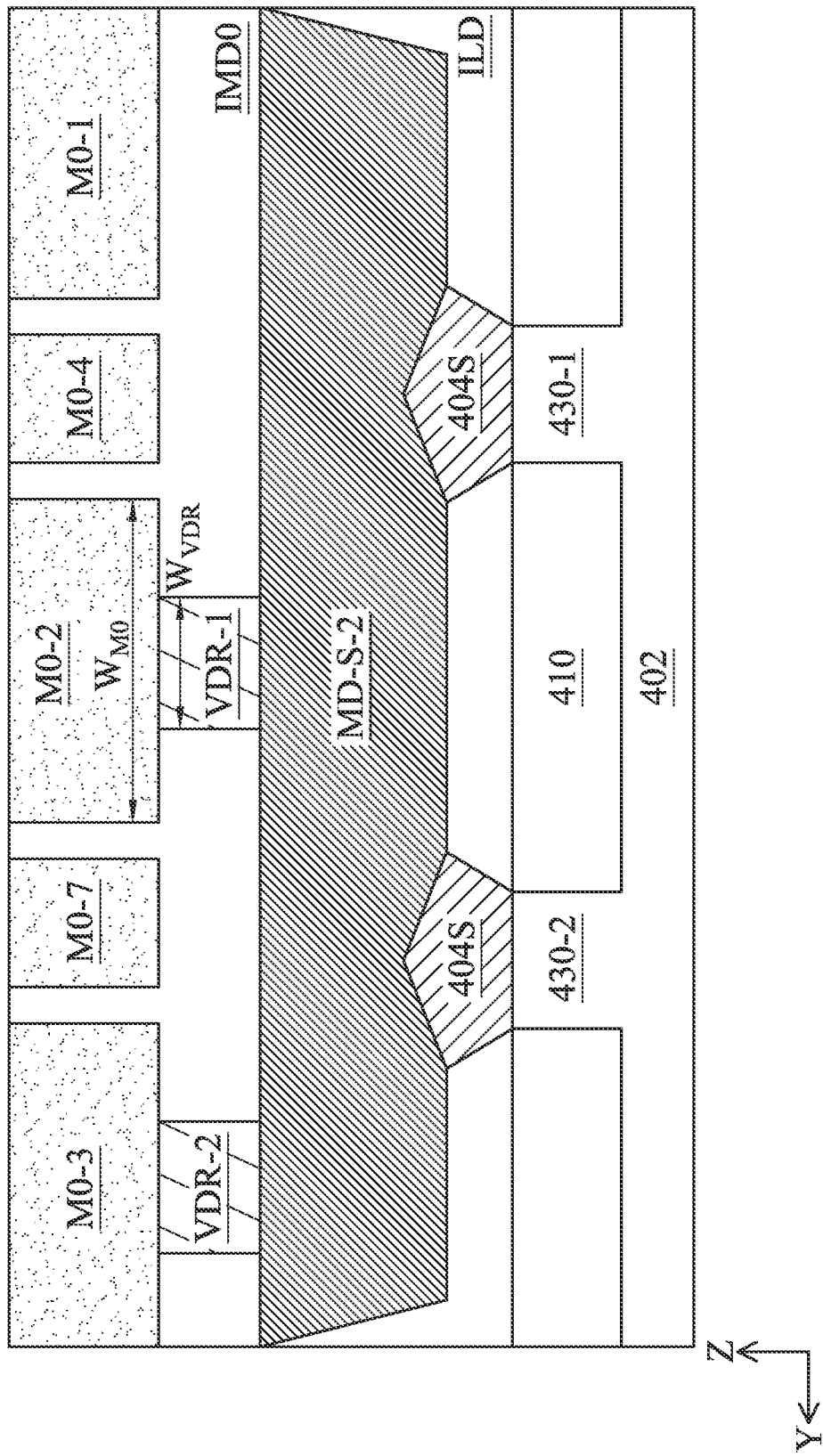

Reference is now made to FIGS. 6A, 6B, 6C, collectively. FIG. 6A illustrates a cross-sectional view taken in the X-Z plane along the A-A line of the portion of the memory array shown in FIG. 5. FIG. 6B illustrates a cross-sectional view taken in the X-Z plane along the B-B line of the portion of the memory array shown in FIG. 5. FIG. 6C illustrates a cross-sectional view taken in the Y-Z plane along the C-C line of the portion of the memory array shown in FIG. 5.

In some embodiments, the substrate 402 may be a semiconductor substrate such as a silicon substrate. The substrate 402 may include various layers, including conductive or insulating layers formed on a semiconductor substrate. The substrate 402 may include various doping configurations depending on design requirements as is known in the art. For example, different doping profiles (e.g., n-wells, p-wells) may be formed on the substrate 402 in regions designed for different device types (e.g., n-type field effect transistors (NFET), p-type field effect transistors (PFET)). The suitable doping may include ion implantation of dopants and/or diffusion processes. The substrate 402 may have isolation features (e.g., shallow trench isolation (STI) features) interposing the regions providing different device types. The substrate 402 may also include other semiconductors such as germanium, silicon carbide (SiC), silicon germanium (SiGe), or diamond. Alternatively, the substrate 402 may include a compound semiconductor and/or an alloy semiconductor. Further, the substrate 402 may optionally include an epitaxial layer (epi-layer), may be strained for performance enhancement, may include a silicon-on-insulator (SOI) structure, and/or may have other suitable enhancement features.

In some embodiments, the active regions 430-1 and 430-2 are fin-like structure designed to form fin-like field effect transistors (FinFETs). The active regions 430-1 and 430-2 may protrude from the substrate 402 and extend in parallel in the X-direction. The fin-like structure may be formed by patterning the substrate 402 using one or more photolithography processes, including double-patterning or multi-patterning processes. The active regions 430-1 and 430-2 are separated by isolation structure 410. The isolation structure 410 may include silicon oxide, silicon nitride, silicon oxynitride, other suitable isolation material (for example, including silicon, oxygen, nitrogen, carbon, or other suitable isolation constituent), or combinations thereof. The isolation structure 230 may include different structures, such as shallow trench isolation (STI) structures, deep trench isolation (DTI) structures, and/or local oxidation of silicon (LOCOS) structures.

Gate structures 404G are formed over the substrate 402 and across the active regions 430. Each of the gate structures 404G includes a gate stack having a gate dielectric and a gate electrode disposed on the gate dielectric. The gate dielectric includes a dielectric material, such as silicon oxide, germanium oxide, high k dielectric material layer or a combination thereof. In another embodiment, the gate dielectric includes an interfacial layer (such as a silicon oxide or germanium oxide layer) and a high-k dielectric material layer on the interfacial layer. The gate electrode includes a conductive material layer, such as doped polycrystalline silicon (polysilicon), metal, metal alloy or combinations thereof. The gate structures 404G may be formed by a procedure that includes forming a gate dielectric layer, forming a gate electrode layer on the gate dielectric layer, and patterning the gate electrode layer and the gate dielectric layer. The formation of the gate structures 404G may further include a gate replacement procedure to replace the previously formed gate stack with high-k dielectric and metal. The gate replacement may include a gate last operation or a high-k last operation where both gate dielectric and gate electrode are replaced at a later fabrication stage. The gate structures 404G may also include gate spacers formed on sidewalls of the gate structures 404G by a procedure that includes deposition and anisotropic etch.

In some embodiments, each of the source regions 404S and drain regions 404D includes an epitaxial source/drain feature formed over the active region 430-1 or 430-2 in the respective source region or drain region. For NFETs, the epitaxial source/drain features may be of n-type doped. For PFETs, the epitaxial source/drain features may be of p-type doped. For example, for NFETs, the epitaxial source/drain features may include silicon and be doped with carbon, phosphorous, arsenic, other n-type dopant, or combinations thereof; and for PFETs, the epitaxial source/drain features may include silicon germanium or germanium and be doped with boron, other p-type dopant, or combinations thereof. The epitaxial source/drain features may be formed by epitaxially growing semiconductor material(s) (e.g., Si, SiGe) over the active regions 430-1 and 430-2, for example, using CVD deposition techniques (e.g., Vapor Phase Epitaxy), molecular beam epitaxy, other suitable epitaxial growth processes, or combinations thereof.

The ILD layer is formed over the substrate 402 and the gate structures 404G. The IMD0 layer is formed over the ILD layer. The ILD layer and the IMD0 layer may be formed of any suitable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The ILD layer and the IMD0 layers may be formed by any acceptable deposition process, such as spin coating, physical vapor deposition (PVD), chemical vapor deposition (CVD), the like, or a combination thereof.

Each of the source contacts MD-S continuously extends in the Y-direction across multiple source regions 404S formed in active regions 430-1 and 430-2. Each of the drain contacts MD-D extends in the Y-direction across the respective drain region 404D but does not extend to adjacent other active regions. In some embodiments, the source contacts MD-S and the drain contacts MD-D are formed by forming trenches in the ILD layer and fill the trenches with conductive materials, such as titanium nitride (TiN), tantalum (Ta), titanium (TiN), tantalum nitride (TaN), ruthenium (Ru), tungsten (W), cobalt (Co), aluminum (Al), molybdenum (Mo), titanium silicide (TiSi), tungsten silicon (WSi), platinum silicide (PtSi), cobalt silicide (CoSi), nickel silicide (NiSi), or a combination thereof. A chemical mechanical polishing (CMP) process may be performed subsequently to remove excessive conductive materials and expose the ILD layer.

The via rails VDR-1 and VDR-2 extends continuously in the X-direction and couples multiple source contacts MD-S together. In some embodiments, the via rails VDR-1 and VDR-2 are formed by forming trenches in the IMD0 layer and fill the trenches with conductive materials, such as titanium nitride (TiN), tantalum (Ta), titanium (TiN), tantalum nitride (TaN), ruthenium (Ru), tungsten (W), cobalt (Co), aluminum (Al), molybdenum (Mo), titanium silicide (TiSi), tungsten silicon (WSi), platinum silicide (PtSi), cobalt silicide (CoSi), nickel silicide (NiSi), or a combination thereof. The vias VD-1 and VD-2 individually land on respective drain contacts MD-D. In some embodiments, the vias VD-1 and VD-2 are formed by forming slots in the IMD0 layer and fill the slots with conductive materials. The conductive material for vias VD-1 and VD-2 may be similar to the via rails VDR-1 and VDR-2. In some embodiments, the via rails VDR-1, VDR-2 and the vias VD-1, VD-2 are formed jointly with the conductive lines M0 in the IMD0 layer using a damascene or dual damascene process. The conductive lines M0 may employ conductive materials such as cobalt (Co), aluminum (Al), copper (Cu), tungsten (W), or a combination thereof.

Referring to FIG. 6A, by having a continuous via rail across multiple source contacts other than isolated vias over each source contact, the contact area is increased between the vias and source contacts, as well as between the vias and the conductive line M0. Accordingly, the routing resistance along the path of the common source line is reduced. Referring to FIG. 6B, the via VD has an extended width $W_{VD}$ measured at its bottom portion, which is larger than a width $W_{MD}$ of the drain contact MD-D measured at its top portion. Accordingly, the whole top surface of the drain contact MD-D is utilized for making contact with the via VD and contributes for a reduced contact resistance, which also helps reducing a portion of the routing resistance in the memory cell. Further, the extended width $W_{VD}$ is larger than the width $W_{MD}$ for about 5% to about 30%. If it is less than about 5%, overlay inaccuracy may cause misalignment between the via VD and the drain contact MD-D; if it is larger than about 30%, the via VD may become too wide and overshadow the adjacent gate structures 404G, which may impact functions of the gate structures or cause electrical shorting. In some embodiments, edges of the via VD is offset from the gate structures 404G. In some alternative embodiments, edges of the via VD is directly above the adjacent gate structures 404G, as illustrated in FIG. 6B. As discussed above, the extended width $W_{VD}$ being no larger than 30% of the width $W_{MD}$ provides a comprise between size of the via VD and performance of the gate structures 404G. Referring to FIG. 6C, the via rail VDR has a width $W_{VDR}$ measured at its top portion, which is smaller than a width $W_{M0}$ of the conductive line M0 measured at its bottom portion. In some embodiments, the width $W_{VDR}$ is about 40% to about 60% smaller than the width $W_{M0}$. If the width $W_{VDR}$ is more than 60% smaller than the width $W_{M0}$, the via rail VDR may become too narrow and lead to higher contact resistance. If the width $W_{VDR}$ is less than 40% smaller than the width $W_{M0}$, the via rail VDR may become too wide and may accidentally short to adjacent conductive lines M0 for drain connections.

Figure 7A:
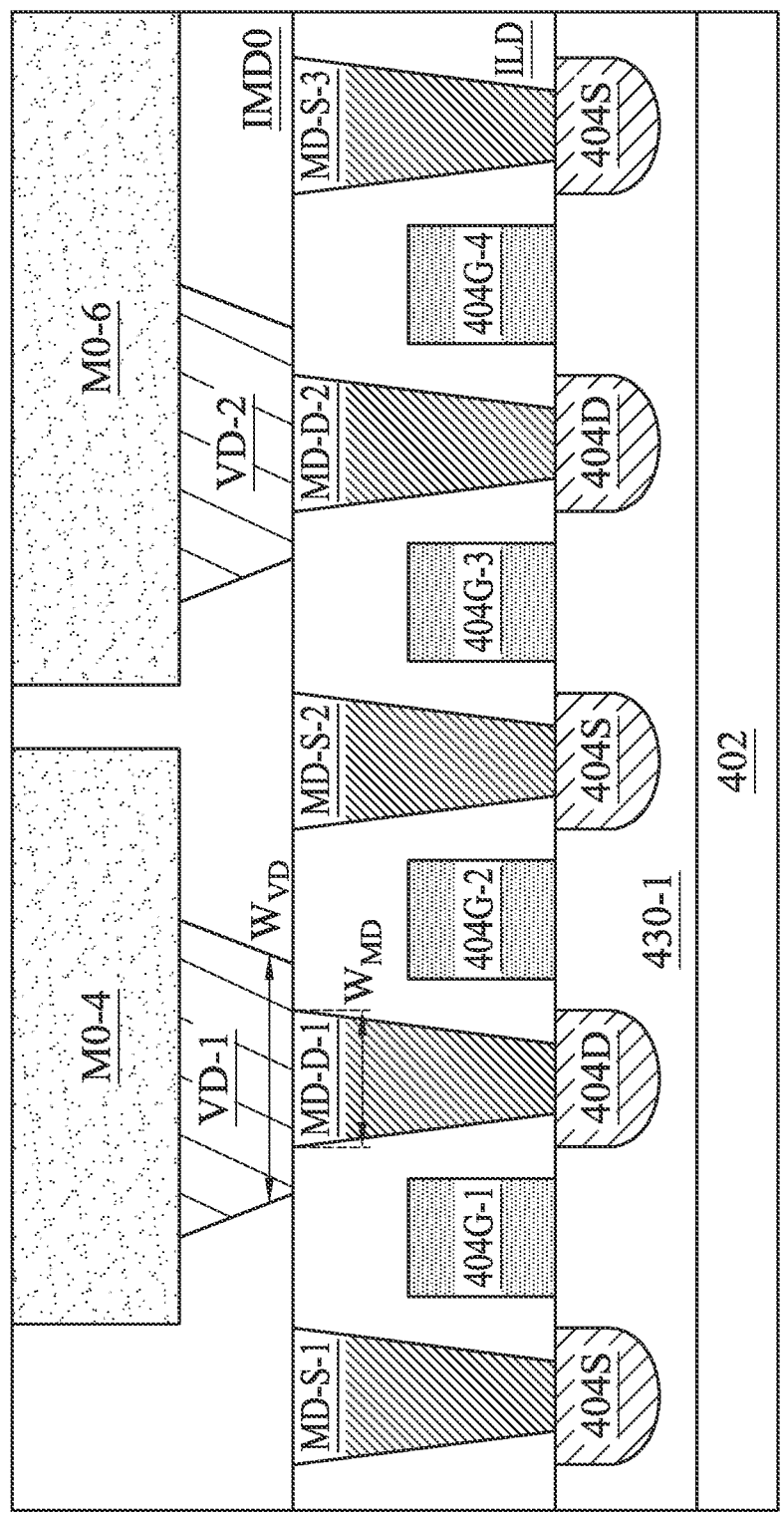
Figure 7B:
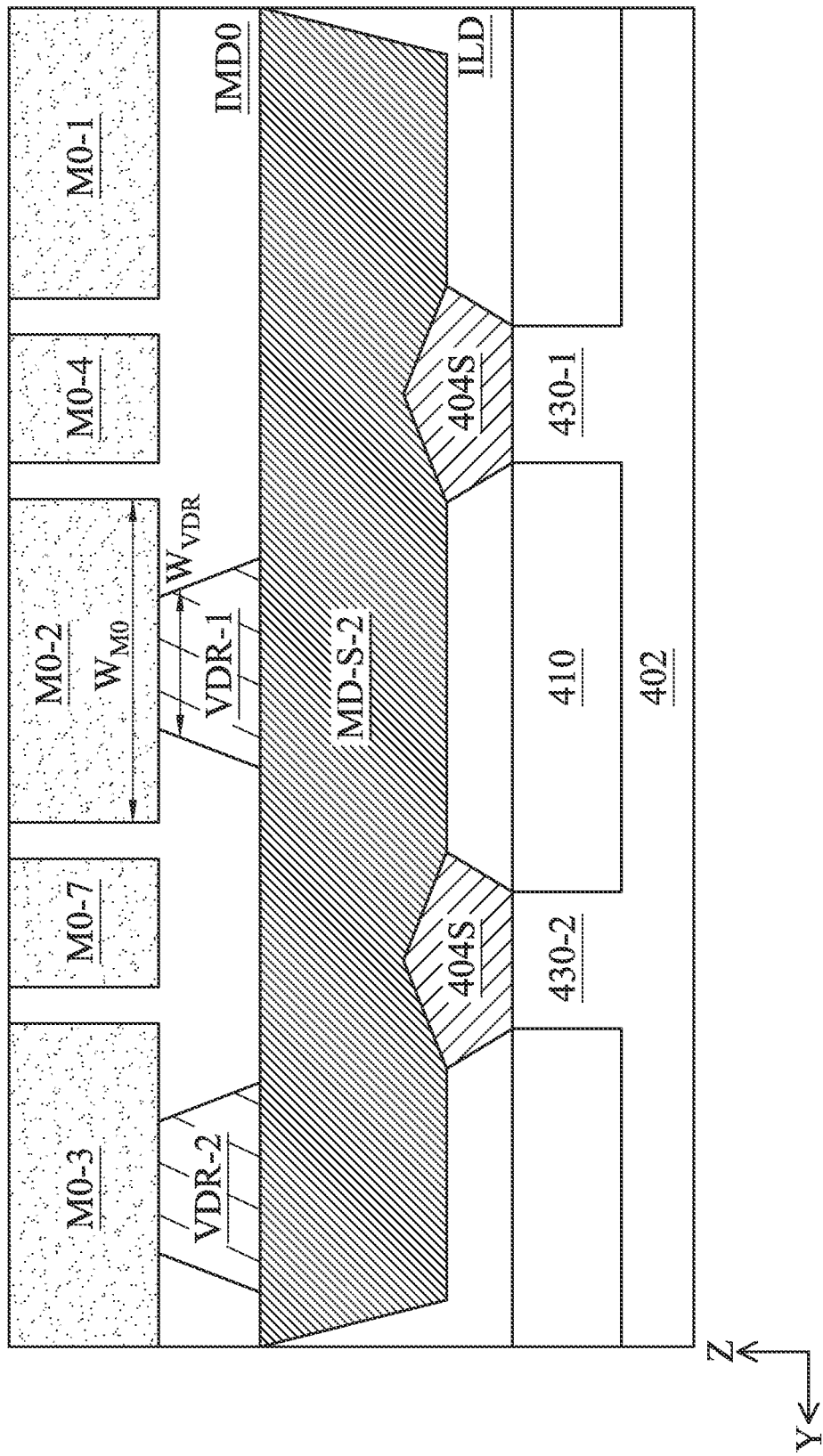

FIGS. 7A and 7B illustrate an alternative embodiment to the cross-sectional views as shown in FIGS. 6B and 6C. FIG. 7A illustrates a cross-sectional view taken in the X-Z plane along the B-B line of the portion of the memory array shown in FIG. 5. FIG. 7B illustrates a cross-sectional view taken in the Y-Z plane along the C-C line of the portion of the memory array shown in FIG. 5. Reference numerals are repeated for ease of understanding and similar aspects are not repeated below in the interest of conciseness. One difference between the embodiments in FIG. 7A and FIG. 6B is that the via VD has a reversed-trapezoid shape, allowing a larger top surface in contact with the conductive line M0, while maintaining the bottom surface with an extended width $W_{VD}$ not larger than 30% of the width $W_{MD}$. The larger top surface of the via VD increases contact area and reduces contact resistance. The reversed-trapezoid shape may be formed by a first etching process that forms tapered sidewalls during slot formation. One difference between the embodiments in FIG. 7B and FIG. 6C is that the via rail VDR has a trapezoid shape, allowing a larger bottom surface in contact with the source contact MD-S, while maintaining the top surface with a width $W_{VDR}$ at least 40% smaller than the width $W_{M0}$. The larger bottom surface of the via rail VDR increases contact area and reduces contact resistance. The trapezoid shape may be formed by a second etching process that expands lower portion of the trench during trench formation. The first etching process and the second etching process may be performed separately to allow the via VD with a reversed-trapezoid shape and the via rail VDR with a trapezoid shape coexist in one structure.

Figure 8:
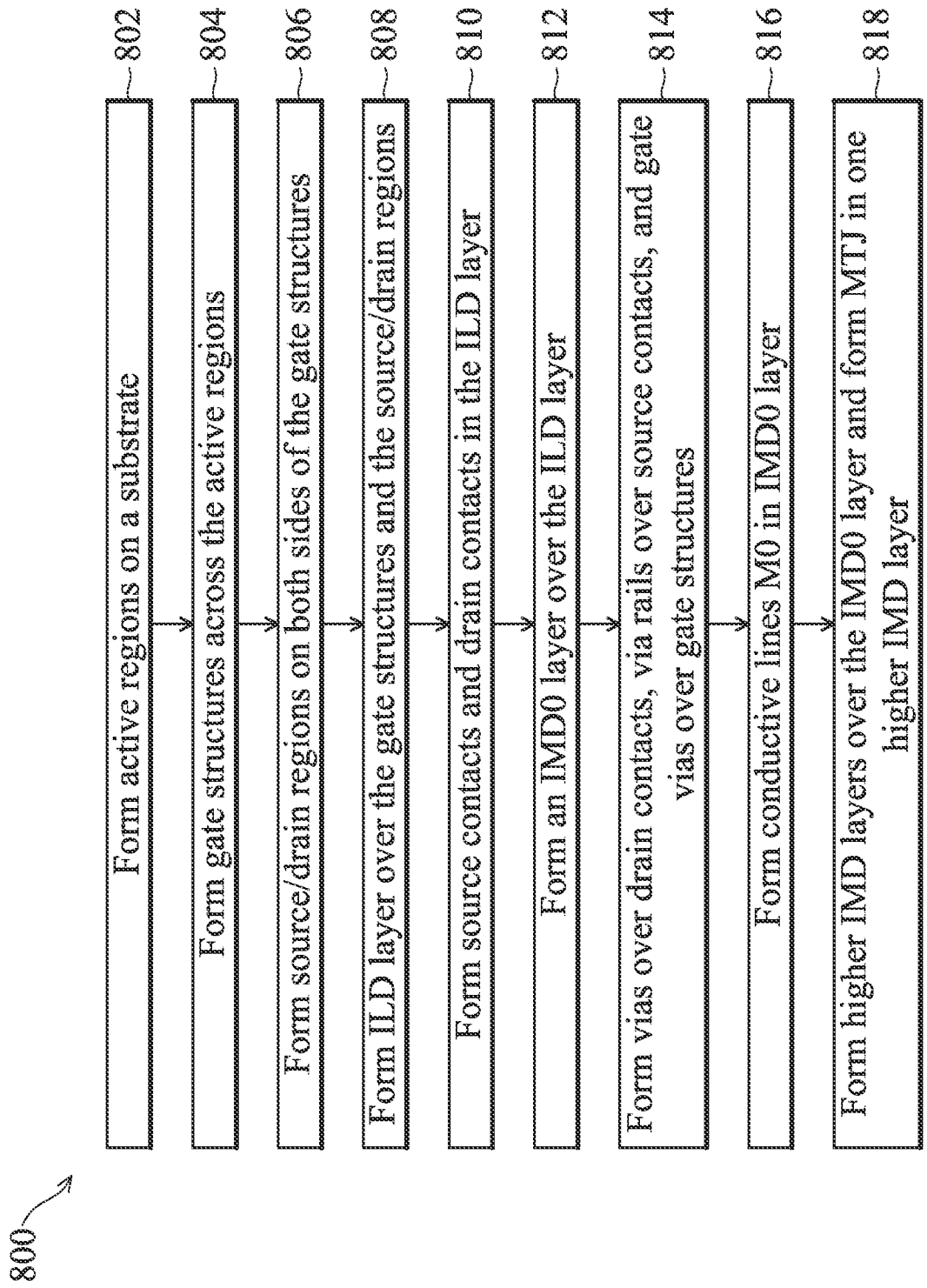
FIG. 8 illustrates a flow chart for a method of forming a semiconductor device with a memory array comprising MTJs, in accordance with some embodiments.

FIG. 8 illustrates a flow chart of a method 800 for forming a semiconductor device having an MRAM array. Many aspects of the semiconductor device are the same as or similar to those of the memory system 100 illustrated in FIG. 1. While method 800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At operation 802, active regions are formed on a substrate, such as active regions 430 in FIG. 5. At operation 804, gate structures are formed across the active regions, such as the gate structures 404G in FIG. 5. At operation 806, source/drain regions are formed in active regions located on both sides of the gate structures, such as the source regions 404S and drain regions 404D in FIG. 5. At operation 808, an ILD layer is formed over the gate structures and the source/drain regions, such as the ILD layer in FIGS. 6A-6C. At operation 810, source contacts and drain contacts are formed in the ILD layer, such as the source contacts MD-S and the drain contacts MD-D in FIG. 5. At operation 812, an IMD0 layer is formed over the ILD layer, such as the IMD0 layer in FIGS. 6B-6C. At operation 814, slot vias are formed over the drain contacts and via rails are formed over the source contacts, such as the slot vias VD and via rails VDR in FIG. 5. At operation 816, conductive lines are formed in the IMD0 layer, such as the conductive lines M0 in FIG. 5. The conductive lines M0 overlapping the via rails VDR provide a common source line for the memory array. At operation 818, other IMD layers are formed over the IMD0 layer and an MTJ structure is formed in one of the higher IMD layers, such as the IMD1~IMD6 and the MTJ structure 420 in FIG. 4.

Although not intended to be limiting, one or more embodiments of the present disclosure provide many benefits to a semiconductor device and the formation thereof. For example, embodiments of the present disclosure provide a semiconductor device with an array of MRAM cells having MTJs. Via rails and slot vias have been implemented to reduce routing resistance and increase sensitivity and speed of the MRAM cells. Furthermore, formation of this semiconductor device can be readily integrated into existing semiconductor fabrication processes.

In one exemplary aspect, the present disclosure is directed to a memory device. The memory device includes a transistor having a first source/drain (S/D) region and a second S/D region, a first S/D contact disposed over the first S/D region, the first S/D contact extending lengthwise in a first direction, a second S/D contact disposed over the second S/D region, a first via landing on the first S/D contact, the first via extending lengthwise in a second direction different from the first direction, a second via landing on the second S/D contact, the first via having a length measured in the second direction that is larger than the second via, a first conductive line coupled to the first via, a second conductive line coupled to the second via, and a memory structure disposed above the transistor and coupled to the second conductive line. In some embodiments, the memory structure is a magnetic tunnel junction (MTJ). In some embodiments, the MTJ has a bottom electrode coupled to the second conductive line. In some embodiments, the first conductive line is directly above the first via, and the first conductive line extends lengthwise in the second direction. In some embodiments, the first conductive line has a width measured in the first direction larger than that of the first via. In some embodiments, the first S/D region is a source region, the second S/D region is a drain region, the first conductive line couples to a common source line of the memory device, and the second conductive line couples to a bit line of the memory device. In some embodiments, the transistor has a length measured in the second direction from an outer edge of the first S/D region to an outer edge of the second S/D region, and wherein the length of the first via is larger than the length of the transistor. In some embodiments, the second via has a width measured in the second direction that is larger than a width of the second S/D contact. In some embodiments, the width of the second via is larger than the width of the second S/D contact for about 5% to about 30%. In some embodiments, the first via and the first conductive line have a same length measured in the second direction.

In another exemplary aspect, the present disclosure is directed to a memory device. The memory device includes an active region having a first source region, a second source region, and a drain region sandwiched between the first and second source regions, a first contact coupled to the first source region and a second contact coupled to the second source region, each of the first and second contacts extending lengthwise along a first direction, a via extending lengthwise along a second direction that is different from the first direction, the via being in contact with the first and second contacts, a conductive line extending lengthwise along the second direction and coupled to the via, and a magnetic tunnel junction (MTJ) disposed above the active region, wherein the MTJ has an electrode coupled to the drain region. In some embodiments, the conductive line is directly above the via. In some embodiments, the via has a width measured in the first direction that is smaller than the conductive line. In some embodiments, the width of the via is about 40% to about 60% smaller than the conductive line. In some embodiments, the via is a first via, and the memory device further includes a third contact coupled to the drain region, and a second via in contact with the third contact, the second via having a width measured in the second direction that is larger than the third contact. In some embodiments, the first via is wider than the second via in the second direction.

In another exemplary aspect, the present disclosure is directed to a method. The method includes forming an active region on a substrate, forming a first source region and a second source region in the active region, forming a first contact over the first source region and a second contact over the second source region, forming a dielectric layer over the first and second contacts, forming a trench in the dielectric layer, the trench extending continuously from the first contact to the second contact in a top view and exposes the first contact and the second contact, filling the trench with a conductive material, thereby forming a via rail, forming a conductive line in the dielectric layer, the conductive line being in contact with the via rail, and forming a memory structure above the conductive line. In some embodiments, the first and second contacts extend lengthwise in a first direction, and the via rail and the conductive line extend lengthwise in a second direction perpendicular to the first direction. In some embodiments, the conductive line fully covers the via rail in the top view. In some embodiments, the method further includes forming a drain region in the active region, the drain region being between the first source region and the second source region, forming a third contact over the drain region, and forming a via in contact with the third contact, the via having a width larger than the third contact.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a transistor having an active region that includes a first source/drain (S/D) region and a second S/D region;
   a first S/D contact disposed over the first S/D region, wherein the first S/D contact extends lengthwise in a first direction and the active region extends lengthwise in a second direction different from the first direction, wherein along the first direction the first S/D contact extends beyond a boundary of the active region in a top view of the memory device;
   a second S/D contact disposed over the second S/D region;
   a first via disposed on the first S/D contact, wherein the first via extends lengthwise in the second direction different from the first direction;
   a second via disposed on the second S/D contact, wherein the first via has a length measured in the second direction that is larger than the second via;
   a first conductive line coupled to the first via;
   a second conductive line coupled to the second via; and
   a memory structure disposed above the transistor and coupled to the second conductive line.

2. The memory device of claim 1, wherein the memory structure is a magnetic tunnel junction (MTJ).

3. The memory device of claim 2, wherein the MTJ has a bottom electrode coupled to the second conductive line.

4. The memory device of claim 1, wherein the first conductive line is directly above the first via, and the first conductive line extends lengthwise in the second direction.

5. The memory device of claim 4, wherein the first conductive line has a width measured in the first direction larger than that of the first via.

6. The memory device of claim 1, wherein the first S/D region is a source region, the second S/D region is a drain region, the first conductive line couples to a common source line of the memory device, and the second conductive line couples to a bit line of the memory device.

7. The memory device of claim 1, wherein the transistor has a length measured in the second direction from an outer edge of the first S/D region to an outer edge of the second S/D region, and wherein the length of the first via is larger than the length of the transistor.

8. The memory device of claim 1, wherein the second via has a width measured in the second direction that is larger than a width of the second S/D contact.

9. The memory device of claim 8, wherein the width of the second via is larger than the width of the second S/D contact for about 5% to about 30%.

10. The memory device of claim 1, wherein the first via and the first conductive line have a same length measured in the second direction.

11. A memory device, comprising:
   an active region having a first source region, a second source region, and a drain region sandwiched between the first and second source regions;
   a first gate structure disposed between the first source region and the drain region;
   a second gate structure disposed between the second source region and the drain region;
   a first contact coupled to the first source region and a second contact coupled to the second source region, wherein each of the first and second contacts extends lengthwise along a first direction;
   a via extending lengthwise along a second direction that is different from the first direction, wherein the via is in contact with the first and second contacts;
   a conductive line extending lengthwise along the second direction and across both the first and second gate structures in a top view of the memory device, wherein the conductive line interfaces a top surface of the via; and
   a magnetic tunnel junction (MTJ) disposed above the active region, wherein the MTJ has an electrode coupled to the drain region.

12. The memory device of claim 11, wherein the conductive line is directly above the via.

13. The memory device of claim 11, wherein the via has a width measured in the first direction that is smaller than the conductive line.

14. The memory device of claim 13, wherein the width of the via is about 40% to about 60% smaller than the conductive line.

15. The memory device of claim 11, wherein the via is a first via, further comprising:
   a third contact coupled to the drain region; and
   a second via in contact with the third contact, wherein the second via has a width measured in the second direction that is larger than the third contact.

16. The memory device of claim 15, wherein the first via is wider than the second via in the second direction.

17. A semiconductor device, comprising:
   a continuous active region having a first source/drain (S/D) region, a second S/D region, and a third S/D region sandwiched between the first and second S/D regions along a first direction;
   a first contact landing on the first S/D region;
   a second contact landing on the second S/D region, wherein each of the first and second contacts extends lengthwise along a second direction perpendicular to the first direction;
   a first via extending lengthwise along the first direction and coupled to the first and second contacts;
   a third contact landing on the third S/D region;
   a second via coupled to the third contact, wherein the first via has a length measured in the first direction that is larger than the second via; and
   a magnetic tunnel junction (MTJ) coupled to the second via.

18. The semiconductor device of claim 17, wherein the MTJ is disposed directly above the third S/D region.

19. The semiconductor device of claim 17, further comprising:
   a first gate structure disposed between the first and third S/D regions; and
   a second gate structure disposed between the second and third S/D regions,
   wherein the first and second gate structures are directly under the first via.

20. The semiconductor device of claim 17, wherein in a cross-sectional view along the second direction, the first via has a top surface narrower than a bottom surface.

* * * * *